United States Patent [19]

Hartmann

[11] Patent Number: 4,605,344
[45] Date of Patent: Aug. 12, 1986

[54] DEVICE FOR DRILLING HOLES IN A STACK OF PLATES

[75] Inventor: Gunter Hartmann, Munich, Fed. Rep. of Germany

[73] Assignee: Siemens Aktiengesellschaft, Berlin & Munich, Fed. Rep. of Germany

[21] Appl. No.: 636,923

[22] Filed: Aug. 2, 1984

[30] Foreign Application Priority Data

Sep. 20, 1983 [DE] Fed. Rep. of Germany ....... 3333978

[51] Int. Cl.⁴ .............................................. B23B 39/00
[52] U.S. Cl. ..................................... 408/95; 408/1 R; 408/72 R
[58] Field of Search ................................... 408/95–98, 408/205, 1 R, 72 R; 219/60 A; 30/97; 198/628; 29/33 M

[56] References Cited

U.S. PATENT DOCUMENTS 4,408,934 10/1983 Ohba et al. ....................... 408/95 X

*Primary Examiner*—Douglas D. Watts
*Attorney, Agent, or Firm*—Hill, Van Santen, Steadman & Simpson

[57] ABSTRACT

A device for drilling holes into a stack of plates such as a stack of printed circuit boards, characterized by an arrangement to provide a cover tape beneath a pressure member of a clamping arrangement to be held by the clamping arrangement on the surface of the stack during the drilling operation to prevent damage to the uppermost plate of the stack. The arrangement for providing the tape preferably includes a supply reel, a takeup reel and a feed device and the tape is preferably guided on the pressure member of the clamping arrangement by a guidance groove.

17 Claims, 2 Drawing Figures

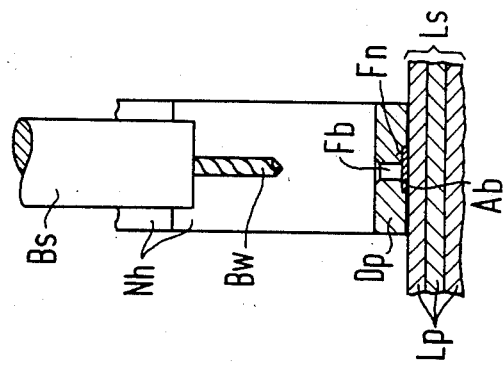
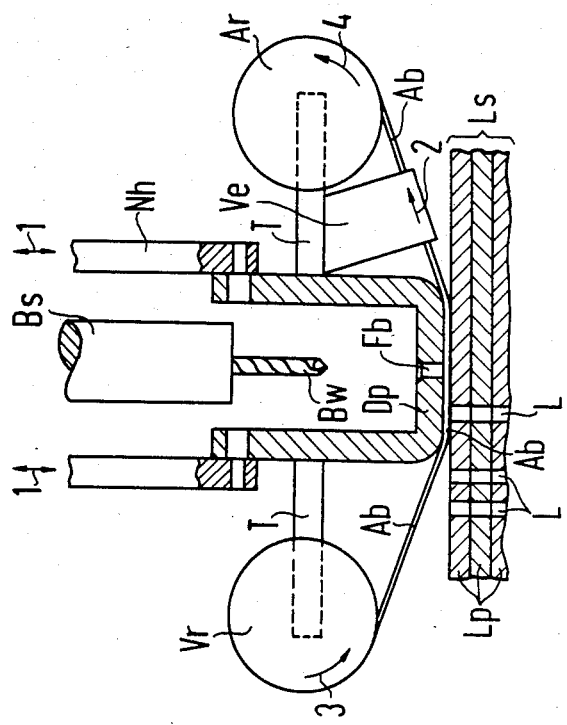

DEVICE FOR DRILLING HOLES IN A STACK OF PLATES

BACKGROUND OF THE INVENTION

The present invention is directed to a device for drilling holes into a workpiece which comprises a plate or a stack of plates particularly printed circuit boards and which device includes a drill spindle accepting a drill bit and a clamping arrangement for engaging the workpiece adjacent the location of the hole being drilled and for holding the workpiece during the drilling operation.

Printed circuit boards are provided with through-holes at the respective mounting positions for the acceptance of leads of individual components. The forming of these holes usually occurs by drilling a stack of printed circuit boards. For example, a plurality of printed circuit boards were stacked one on top of another to form a stack and then are drilled so that a single drilling will form the same hole in each board. However, without additional protective measures, ejecta, which makes the respectively topmost printed circuit board unusable, will occur. In order to avoid this, an approximately 0.5 mm thick, special throwaway plate of aluminum or hard paper will usually accompany this stack of printed circuit boards as the topmost layer and is connected to the stack of printed circuit boards at the edges with the assistance of an adhesive tape.

When a batch of the drill devices is to be mechanized, for example, by using industrial robots, the emplacement and gluing of a throwaway plate on a stack of printed circuit boards as well as the undoing of the gluing and removal of the throwaway plate represents additional work steps. These additional work steps will lead to a loss of time and also to a deterioration of the production reliability.

SUMMARY OF THE INVENTION

It is thus the object of the present invention to create a device for drilling holes into a workpiece, which is a stack of printed circuit boards with the uppermost printed circuit board of the stack being protected, with a low cost and without significant loss of time during the spot drilling operation.

To accomplish these goals, the present invention is directed to an improvement in the device for drilling holes into a workpiece, said device having a drill spindle accepting a drill bit and clamping means for engaging the workpiece adjacent the location of the hole being drilled and for holding the workpiece during the drilling operation. The improvements are means for positioning a cover tape on the surface of the workpiece beneath the drill bit and clamping means, said means for positioning and enabling the tape to be displaced in a longitudinal direction and the clamping means pressing the cover tape onto the surface of the workpiece.

The protection of the uppermost plate of a stack of plates thus occurs by means of the cover tape, which can be displaced in its longitudinal direction and which can thus be used independently of the hole occupation of the stack of plates. The cover tape is thereby pressed by the clamping means against the stack of plates just shortly before and during the drilling event and is subsequently released from the stack of plates by the lifting up of the clamping means. A necessary work step of emplacement, gluing, undoing the gluing and removing the throwaway plate when utilizing the throwaway plates are thus eliminated. With the present invention, the introduction of holes into a stack of plates can be mechanized with a high production reliability. A considerable material savings also occurs due to the employment of the cover tape independent of the hole occupation and due to the elimination of the adhesive tape that has heretofore been required.

The cover tape preferably consists of aluminum which offers a particularly effective protection for the uppermost plate in the stack of plates when spot-drilling. The cover tape, however, can also consist of a synthetic plastic and the plastic may be selected to provide drilling properties similar to aluminum.

According to the preferred embodiment of the invention, the cover tape can be displaced step-by-step by means of a feed apparatus or feed means. The material of the cover tape can be exploited in a particularly efficient manner by means of the precise, step-by-step control with the assistance of the feed apparatus. It has therefore proven practical when the feed apparatus or means advances the cover tape by about twice the amount of the diameter of the drill bit in each step. It is also advantageous to dispose the feed apparatus or means downstream of the clamping means as seen in the conveying direction of the cover tape because it is easier to pull the relative thin cover tape than to push it.

A particularly beneficial and simple offering of the cover tape is achieved in that the cover tape is unwound from a supply reel and the used tape is taken up on a takeup reel. The removal of the perforated and no longer usable cover tape can be designed in a particularly simple fashion with the assistance of such a takeup reel. In particular, the takeup reel can also assume the step-by-step feed of the cover tape by means of a stepped control. A better material exploitation given high production reliability, however, is achieved given employment of a separate feed apparatus so that the takeup reel is then disposed downstream of the feed apparatus as seen in the conveying direction of the cover tape.

According to further preferred embodiments of the invention, the supply reel, the feed apparatus and the takeup reel are secured to a cross-arm which extends in the conveyor direction of the cover tape and is secured on the clamping means. A compact conveyor or transport unit for the cover tape is created in this fashion. It is then also expedient particularly of a tool changer that is to be automatically executed when the cross-arm is pivoted to the side to such an extent that the drill spindle is accessible for changing the drilling bit or tool.

Another advantageous development of the invention consists in that of the cover tape is guided by the underside of the clamping means. The underside of the clamping means is thus exploited as a guide surface for the cover tape and particularly good lateral guidance with a corresponding narrow cover tape can be achieved when a guide channel for the cover tape is provided on the underside surface of the clamping means. Guidance of the cover tape, however, can also be further improved if the holddown or clamping means comprises rounded edges at the leading point and at the departure point for the cover tape.

BRIEF DESCRIPTION OF THE DRAWINGS

FIG. 1 is a longitudinal cross-section with portions in elevation for purposes of illustration of a device for drilling a stack of printed circuit boards in accordance with the present invention; and FIG. 2 is a transverse cross-sectional view of the device for drilling in accordance with FIG. 1.

DESCRIPTION OF THE PREFERRED EMBODIMENTS

In order to introduce holes L into a printed circuit board Lp, a plurality of printed circuit boards Lp are piled on top of one another to form a printed circuit board stack Ls or workpiece which is positioned on a drilling machine table of a vertical drill or a multiple spindle drill press of a standard construction. In the drawings, only the drill spindle Bs in which a drilling bit or tool Bw is chucked is shown. In addition, the legs of a holddown clamp or clamping means Nh, which is raisable and lowerable in the direction of double arrows 1 are situated on both sides of the drill spindle Bs. The clamping means includes a pressure plate or member Dp, which has a U shape and is interchangeably attached via releasable fastening means to the legs of the clamping means Nh. As a result, a guide bore Fb of the pressure plate Dp is situated precisely below the drill spindle Bs and can be matched to the diameter of the drill bit or tool Bw which is being utilized.

The principles of the present invention are the improvement which is the provision of means for positioning a cover tape Ab on the surface of the workpiece Ls and beneath the pressure plate Dp and the drill spindle Bs. As illustrated, this means for positioning includes a pair of brackets which are attached to the legs of the U-shaped pressure plate Dp to form a cross-arm T. The cross-arm T on one end has a supply reel Vr and a takeup reel Ar secured to the opposite end. Extending from the supply reel Vr, the cover tape Ab passes beneath the lower surface of the pressure plate Dp to the takeup reel Ar. The cover tape Ab can thus be displaced step-by-step by means of a feed apparatus or means Ve which is attached to the cross-arm T between the pressure plate Dp and the takeup reel Ar so that the conveying direction of the cover tape Ab and the corresponding rotation directions of the supply reel Vr and the takeup reel Ar are indicated by the arrows 2, 3 and 4. The pressure plate Dp of the holddown clamp or means Nh comprises a round edge at the leading point of the cover tape Ab and at the departure point. As may additionally be seen from FIG. 2, a guide channel Fn having a rectangular cross-section is formed in the underside or bottom of the pressure plate Dp of the clamping means Nh for guiding the cover tape Ab. The guidance of the cover tape Ab will thus be precisely below or beneath the drill spindle Bs, the drilling bit Bw and the guide bore Fb so that reproducible results are obtainable when the drilling bit Bw drills through the cover tape Ab and into the circuit board stack Ls.

Given utilization of the above-described drilling means, the work sequence takes on the following form for producing holes L in a printed circuit board stack such as Ls. In the first step, the clamping means Nh is lowered with the cover tape Ab being pressed against the surface of the printed circuit stack Ls. A hole L is then drilled. The clamping means Nh and the cover plate Ab are then raised and while in a raised position, the cover tape is advanced a given amount or distance. In the embodiment illustrated, this advance of the cover tape is handled by the feed apparatus Ve with the advance tape being wound up on the takeup reel Ar.

After this work sequence, the drill spindle Bs is prepared for a new cycle. Since the advance or, respectively, winding of the cover tape Ab occurs during the repositioning of the printed circuit board stack Ls, the down-time for the machine is not lengthened or is only insignificantly lengthened.

If required for automatic changing of tool bits Bw, the holddown clamp Nh together with the conveying means or unit for the cover tape AB which comprises the supply reel Vr, the feed apparatus Ve and the takeup reel AR can be laterally pivoted away from beneath the spindle Bs. Given the employment of multiple spindle drill presses, every drill unit is to be equipped with the above-described tape arrangement.

When forming a hole L, the cover tape Ab is pressed against the upper surface of the printed circuit board stack Ls and protects the uppermost printed circuit board Lp and thus prevents ejecta when spot-drilling. An aluminum tape that is 0.5 mm thick and about 10 mm wide, is utilized as the cover tape Ab. When advancing the cover tape Ab, the feed apparatus Ve is set to a division which approximately corresponds to twice the diameter of the drill bit Bw. As a result thereof, an optimum exploitation of the material of the cover tape is achieved and only about 0.3 through 0.5 $cm^2$ is required per drilling operation.

Although various minor modifications may be suggested by those versed in the art, it should be understood that I wish to embody within the scope of the patent granted hereon, all such modifications as reasonably and properly come within the scope of my contribution to the art.

I claim:

1. In a device for drilling holes into a workpiece, said device having a drill spindle accepting a drill bit and clamping means for engaging the workpiece adjacent the location of the hole being drilled and for holding the workpiece during the drilling operation, the improvements comprising means for positioning a cover tape on the surface of the workpiece beneath clamping means and directly beneath the drill bit, said means for positioning enabling the tape to be displaced in a longitudinal direction, and said clamping means pressing the cover tape onto a surface of the workpiece during a drilling operation so that as the drill bit drills through the cover tape and into the workpiece, the tape prevents ejecta from the workpiece.

2. In a device according to claim 1, wherein the cover tape consists of aluminum.

3. In a device according to claim 1, wherein the cover tape consists of a synthetic plastic.

4. In a device according to claim 1, which includes feed means for a step-by-step displacement of the cover tape.

5. In a device according to claim 4, wherein the feed means at every step displaces the cover tape by a distance which is approximately twice the diameter of the drill bit.

6. In a device according to claim 4, wherein the feed means is positioned downstream of the clamping means as seen in the direction for conveying the cover tape.

7. In a device according to claim 1, which includes a supply reel for storing the tape, said tape being unwound from said supply reel.

8. In a device according to claim 7, which includes a takeup reel disposed downstream of the clamping means for receiving tape conveyed beneath the clamping means.

9. In a device according to claim 8, which includes feed means disposed between the take up reel and the clamping means for feeding the cover tape to the takeup reel.

10. In a device according to claim 9, which includes a cross-arm secured to the clamping means, said cross-arm supporting the supply reel, the feed means, and the takeup reel.

11. In a device according to claim 10, wherein the clamping means and the cross-arm are pivotable toward one side to enable access to the drill spindle to change the drill bit.

12. In a device according to claim 9, wherein the clamping means has a pressure plate and the undersurface of the pressure plate has means for guiding the cover tape.

13. In a device according to claim 12, wherein the means for guiding comprises a guide channel for a cover tape on the undersurface of the pressing member.

14. In a device according to claim 13, wherein the pressure member has rounded edges at the leading and the departure point for the cover tape.

15. In a device according to claim 1, wherein the clamping means has a U-shaped member with the bight portion of the U-shaped member being a pressure member provided with means for guiding the cover tape.

16. In a device according to claim 15, wherein the means for guiding comprises a guide channel formed in the pressure surface of the U-shaped member.

17. In a device according to claim 16, wherein the legs of the U-shaped member and the pressure member have rounded corners at the input and departure points for the cover tape.

* * * * *